(12) United States Patent
Schmitt et al.

(10) Patent No.: US 11,479,875 B2
(45) Date of Patent: Oct. 25, 2022

(54) SYSTEM FOR HORIZONTAL GROWTH OF HIGH-QUALITY SEMICONDUCTOR SINGLE CRYSTALS BY PHYSICAL VAPOR TRANSPORT

(71) Applicant: SiCrystal GmbH, Nuremberg (DE)

(72) Inventors: Erwin Schmitt, Großenseebach (DE); Michael Vogel, Nuremberg (DE)

(73) Assignee: SiCrystal GmbH, Nuremberg (DE)

( * ) Notice: Subject to any disclaimer, the term of this patent is extended or adjusted under 35 U.S.C. 154(b) by 0 days.

(21) Appl. No.: 16/894,337

(22) Filed: Jun. 5, 2020

(65) Prior Publication Data

US 2021/0002787 A1 Jan. 7, 2021

(30) Foreign Application Priority Data

Jul. 3, 2019 (EP) .................................... 19184259

(51) Int. Cl.
*C30B 35/00* (2006.01)
*C30B 25/16* (2006.01)
*C30B 25/08* (2006.01)
*C30B 29/36* (2006.01)

(52) U.S. Cl.
CPC .............. *C30B 25/16* (2013.01); *C30B 25/08* (2013.01); *C30B 29/36* (2013.01); *C30B 35/002* (2013.01)

(58) Field of Classification Search
CPC ......... C30B 23/00; C30B 23/02; C30B 23/06; C30B 29/00; C30B 29/10; C30B 29/36; C30B 25/08; C30B 25/16; C30B 35/00; C30B 35/002; C30B 35/005

USPC ... 117/84, 88, 101–102, 200, 204, 902, 937, 117/951
See application file for complete search history.

(56) References Cited

U.S. PATENT DOCUMENTS

| | | | |
|---|---|---|---|
| 5,707,446 A | 1/1998 | Volkl et al. | |
| 7,279,040 B1 * | 10/2007 | Wang | ...................... C30B 23/00 117/83 |
| 8,865,324 B2 | 10/2014 | Straubinger et al. | |
| 9,228,274 B2 | 1/2016 | Rengarajan et al. | |
| 10,801,126 B2 | 10/2020 | Drachev et al. | |

(Continued)

FOREIGN PATENT DOCUMENTS

| | | |
|---|---|---|
| CN | 101036215 A1 | 9/2007 |
| CN | 201545935 U1 | 8/2010 |

(Continued)

OTHER PUBLICATIONS

European Search Report, App No. 19 18 4259, dated Nov. 18, 2019, 8 pages.

(Continued)

*Primary Examiner* — Kenneth A Bratland, Jr.
(74) *Attorney, Agent, or Firm* — Barley Snyder

(57) ABSTRACT

A system for manufacturing one or more single crystals of a semiconductor material by physical vapor transport (PVT) includes a reactor having an inner chamber adapted to accommodate a PVT growth structure for growing the one or more single crystals inside. The reactor accommodates the PVT growth structure in an orientation with a growth direction of the one or more single crystals inside the PVT growth structure substantially horizontal with respect to a direction of gravity or within an angle from horizontal of less than a predetermined value.

9 Claims, 9 Drawing Sheets

(56) References Cited

U.S. PATENT DOCUMENTS

| | | |
|---|---|---|
| 2007/0151509 A1* | 7/2007 | Park ............... C01B 21/0722 117/200 |
| 2007/0256630 A1 | 11/2007 | Wang |
| 2008/0156255 A1 | 7/2008 | Basu et al. |
| 2010/0068381 A1 | 3/2010 | Lin |
| 2011/0300323 A1* | 12/2011 | Straubinger ............ C30B 29/36 117/86 |
| 2012/0058630 A1 | 3/2012 | Quinn et al. |
| 2013/0280466 A1 | 10/2013 | Ilya et al. |
| 2013/0305983 A1* | 11/2013 | Straubinger ............ C30B 29/36 118/726 |
| 2016/0138185 A1 | 5/2016 | Hori et al. |
| 2017/0321345 A1 | 11/2017 | Xu et al. |
| 2021/0002785 A1* | 1/2021 | Schmitt ............... C30B 23/005 |

FOREIGN PATENT DOCUMENTS

| | | |
|---|---|---|
| CN | 102732953 A1 | 10/2012 |
| CN | 104120489 A | 10/2014 |
| CN | 105518187 A1 | 4/2016 |
| EP | 1852528 A1 | 11/2007 |
| EP | 2664695 A1 | 11/2013 |
| JP | 2005200248 A | 7/2005 |
| JP | 2007-308364 A | 11/2007 |
| JP | 2009155137 A | 7/2009 |
| JP | 2009212531 A | 9/2009 |
| JP | 2010037189 A | 2/2010 |
| JP | 2016531836 A | 10/2016 |
| JP | 2018039715 A | 3/2018 |
| KR | 20170034812 A | 3/2017 |
| KR | 20170034812 A * | 3/2017 |
| WO | 2015035140 A1 | 3/2015 |
| WO | 2017057742 A1 | 4/2017 |

OTHER PUBLICATIONS

Office Action from the Japanese Patent Office in Japanese Patent Appln. No 2020-038469, dated Sep. 7, 2021, and English translation thereof, 17 pp.
Abstract of JP 2005200248 (A), dated Jul. 28, 2005, 1 p.
Abstract of JP2 009155137 (A), dated Jul. 16, 2009, 1 p.
Abstract of WO 2017057742 (A1), dated Apr. 6, 2017, 1 p.
Abstract of JP 2010037189 (A), dated Feb. 18, 2010, 1 p.
Chine Office Action and English Translation, Application No. 202010419654.3, dated Dec. 31, 2021, 29 pages.
Chinese Office Action with English Translation, Application No. 202010419654.3, dated Jul. 6, 2022, 34 pages.

* cited by examiner

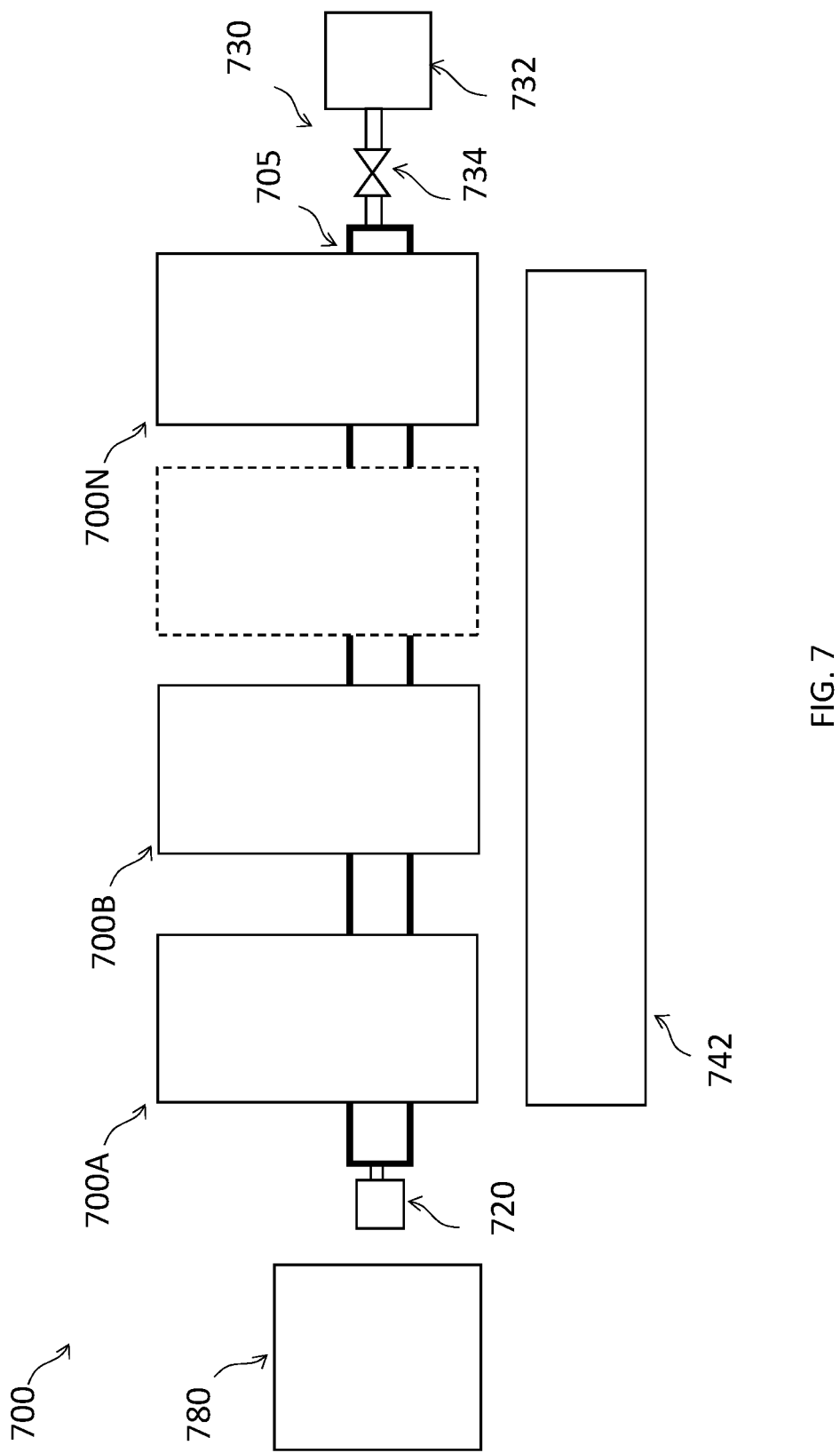

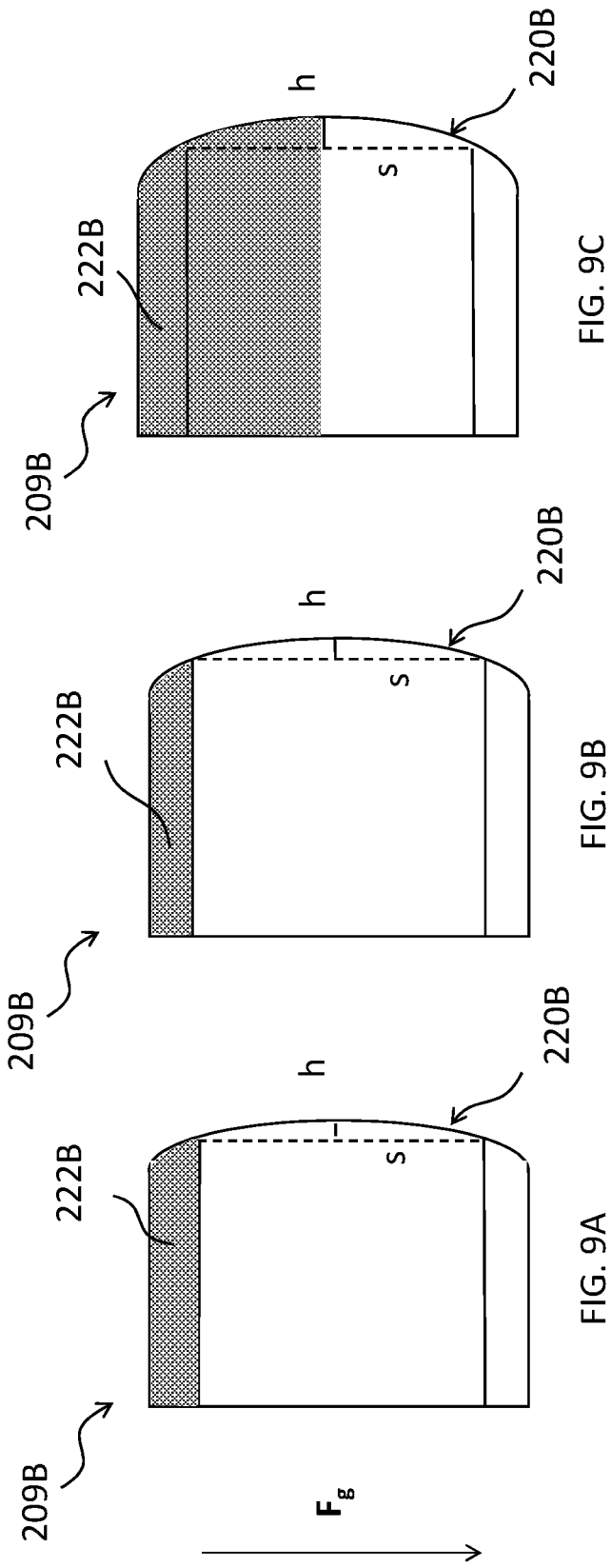

SYSTEM FOR HORIZONTAL GROWTH OF HIGH-QUALITY SEMICONDUCTOR SINGLE CRYSTALS BY PHYSICAL VAPOR TRANSPORT

CROSS-REFERENCE TO RELATED APPLICATION

This application claims the benefit of the filing date under 35 U.S.C. § 119(a)-(d) of European Patent Application No. 19184259.0, filed on Jul. 3, 2019.

FIELD OF THE INVENTION

The present invention relates to systems and methods for growing bulk semiconductor single crystals and, more particularly, for horizontal growth of semiconductor single crystals, such as silicon carbide, in a horizontal direction with respect to the direction of gravity based on physical vapor transport.

BACKGROUND

Silicon carbide (SiC) is extensively used as a semiconductor substrate material for electronic components in a wide range of applications, such as power electronics, radio frequency and light emitting semiconductors components.

Bulk SiC single crystal boules are generally grown using physical vapor transport (PVT) methods, in particular, for commercial purposes. SiC substrates are then produced from the single crystal boule by cutting slices or wafers from the bulk SiC crystal (for e.g. using wire saws) and finishing the substrate surface with a sequence of polishing steps. The finished SiC substrates are employed in the manufacturing of semiconductor components, such as in epitaxial processes where thin monocrystalline layers of a suitable semiconductor material (e.g., SiC, GaN) are deposited onto the SiC substrate. The characteristics of the deposited monolayers and the electronic components produced therefrom depend crucially on the quality and homogeneity of the underlying substrate. For this reason, the outstanding physical, chemical, electrical and optical properties of SiC makes it a preferred semiconductor substrate material for power device applications.

Physical vapor transport (PVT) is a crystal growing method that essentially involves sublimation of a suitable source material followed by re-condensation at a seed crystal, where the formation of the single crystal takes place. The source material and seed crystal are placed inside a growth structure, where the source material is sublimed by heating. The sublimed vapor then diffuses towards the seed in a controlled manner, due to a temperature gradient established between source material and seed crystal, and deposits onto the seed where it grows as a single crystal.

The core of the PVT-based growth system is the so-called reactor, which provides a chamber where the growth structure is placed and a low-pressure atmosphere suitable for the growth of the single crystal is created. The inner walls of the growth structure are in general made of a porous graphite with density of, for example at least 1.75 g/cm3, through which doping components in gaseous form or inert gases may penetrate into the growth compartment by porosity. Heat for subliming the source material inside the PVT growth structures is generally provided by either inductive or resistive heating systems. The temperature within the growth structure is measured by one or more pyrometers or thermocouples installed close to an overture of the growth structure. The vacuum-sealed reactor is evacuated by one or more vacuum pumps and supplied with inert or doping gases via one or more gas feeds to create a controlled gas (gas mixture atmosphere). All process parameters (pressure, temperature, gas flow, etc.) can be adjusted, controlled and stored by a computer-operated system controller, which communicates with all involved components (for e.g. inverter, pyrometer, vacuum control valve, MFC, and pressure gauges, as described with more detail below with reference to FIG. 3).

In the case of inductively-heated PVT systems, the reactor usually includes one or more glass tubes, which are optionally cooled with water and provided at both ends with flanges to complete the interior of the reactor against the atmosphere. An example of such an inductively heated PVT system is described in U.S. Pat. No. 8,865,324 B2. The heating induction coil is mounted outside the reactor and usually surrounded by a "Faraday cage" that provides a shield from electromagnetic radiation. In conventional resistively-heated PVT systems, the heating resistive elements are mounted inside the reactor. In case the reactor is made of metal, it can be cooled by water or air. Examples of resistively-heated PVT systems are described in published patent applications US 2016/0138185 and US 2017/0321345.

Such PVT growth systems known in the art are vertically oriented, i.e. both the reactor and the PVT growth structure arranged inside are oriented with the respective longitudinal axis, which essentially correspond to the growth direction of the single crystal(s), parallel to the gravity direction. The vertical orientation is in general used because the graphite/carbon materials forming the inner walls of the PVT growth structure are attacked by the components of the sublimed source material (for e.g. Si-containing gaseous species) and the high temperatures reached during the growth process. The subsequent degradation of the graphite/carbon material results in graphite particles being detached from the inner walls and released into the crystal growth compartment, which then fall towards the PVT growth structure lower side under the effect of gravity. In systems with both vertically oriented reactor and PVT growth structure, the crystal boule grows on an upper side of the PVT growth structure so that the released graphite/carbon particles do not come into contact with the growing crystal. Thus, high-quality single crystals can still be produced in conventional vertical PVT growth systems since the single crystal boule growing on the upper side of the PVT growth structure is not contaminated by graphite particles released during the growth process.

FIG. 1 illustrates an exemplary growth structure 100 for producing one single crystal boule in a vertical orientation, as commonly employed in conventional PVT growth systems. The vertical direction is represented in FIG. 1 by an arrow indicating the direction of the gravity force vector Fg. The PVT growth structure 100 has a crucible 102 where a source material compartment 104 with a source material 106 (for e.g. SiC in powder or granular form) is provided on a lower side (with respect to gravity) and a seed crystal 108 is arranged in a growth compartment 110 on an upper side and at a certain distance, along a longitudinal axis 116, from the source material compartment 106. A heat dissipation channel 112 on top of the crucible 102 provides cooling to the seed crystal 108. The PVT growth structure 100 may also include thermal insulation 114 surrounding the crucible 102. The thermal insulation 114 is in general made of a porous, thermal insulating material, such as foam-like graphite, with a porosity higher than that of the crucible graphite material itself.

In the PVT growth structure 100 shown in FIG. 1, the single crystal boule 109 grows onto the crystal seed 108 along the longitudinal axis 116, which is in general aligned in the direction of the gravity force (Fg), and on the upper side of the crucible 102 so that the single crystal boule 109 is not contaminated by graphite particles during crystal growth. However, because only one single crystal can be grown, at a time, with such vertical oriented PVT growth structures and PVT growth systems, this results in important economic disadvantages.

Patent application publication EP 2 664 695 describes a process that allows simultaneously manufacturing two single crystals within a same vertical PVT growth structure. A single crystal is grown at a top side of the PVT growth structure, which is vertically arranged inside a vertical reactor, such as described in the prior art, and a second crystal is simultaneously grown on a bottom side of the PVT growth structure. In this configuration, graphite/carbon particles released from the inner walls of the PVT growth structure may still fall onto the crystal boule growing on a lower side of the PVT growth structure, thereby forming graphite/carbon inclusions inside the crystal during the growth process that significantly reduce crystal quality. Graphite/carbon inclusions also reduce the yield of high-quality substrates and wafers, and therefore, results in undesirable rejections and quality loss of the produced single crystals, with a negative economic impact.

For this reason, most of the known PVT systems for manufacturing semiconductor crystal boules still make use of vertically oriented reactors and PVT growth structures that grow one single crystal at the upper side of the PVT growth structure to avoid graphite/carbon particle contamination. In the case of the process described in EP 2 664 695, the disadvantages that crystal growth in a vertically orientation entails have been accepted.

The contamination with graphite/carbon particles come from, for example the cylindrical walls of the crucible, or from the material of a membrane that separates the source material from the growth compartment. With respect to the contamination arising from the cylindrical walls of the crucible, the emission of contamination particles could be reduced or even eliminated by employing carbon free materials, such as tantalum, or by coating the graphite-based material of the inner walls, for example with tantalum carbide (TaC). Similar materials could be used for the membrane that separates the source material compartment from the growth compartment inside the crucible. In both cases, however, the gas phase inside the crucible is negatively affected, since the reduction of the amount of carbon forming the crucible and/or separation membranes may lead to modification changes in the growing crystals (e.g. 6H—SiC or 15R—SiC at 4H—SiC) during the growth process and therefore, lead to a noticeable degeneration of the crystals quality. These modification changes correspond to complete or partial change of the crystal structure in the case of SiC, which may appear in many crystal structures. Each crystal structure prefers different growth conditions so that the growth of the 4H structure tends to become unstable and the growth of 6H and 15R structures stable when carbon is removed from the system.

SUMMARY

A system for manufacturing one or more single crystals of a semiconductor material by physical vapor transport (PVT) includes a reactor having an inner chamber adapted to accommodate a PVT growth structure for growing the one or more single crystals inside. The reactor accommodates the PVT growth structure in an orientation with a growth direction of the one or more single crystals inside the PVT growth structure substantially horizontal with respect to a direction of gravity or within an angle from horizontal of less than a predetermined value.

BRIEF DESCRIPTION OF THE DRAWINGS

Further features and advantages will become apparent from the following and more detailed description of the invention, as illustrated in the accompanying drawings, in which:

FIG. 7 is a schematic diagram of a PVT growth system for horizontal growth of a plurality of semiconductor crystal boules according to an embodiment, the PVT growth system including N horizontally reactors connected by a common vacuum channel to a common vacuum pump system;

FIG. 9A is a schematic sectional view of a semiconductor single crystal boule grown in the horizontal orientation with a maximum height of a growth surface with respect to a segment of 2 mm;

FIG. 9B is a schematic sectional view of a semiconductor single crystal boule grown in the horizontal orientation with a maximum height with respect to a segment of 8 mm; and FIG. 9C is a schematic sectional view of a semiconductor single crystal boule grown in the horizontal orientation with a maximum height with respect to a segment greater than 8 mm.

DETAILED DESCRIPTION OF THE EMBODIMENT(S)

Figure 1:
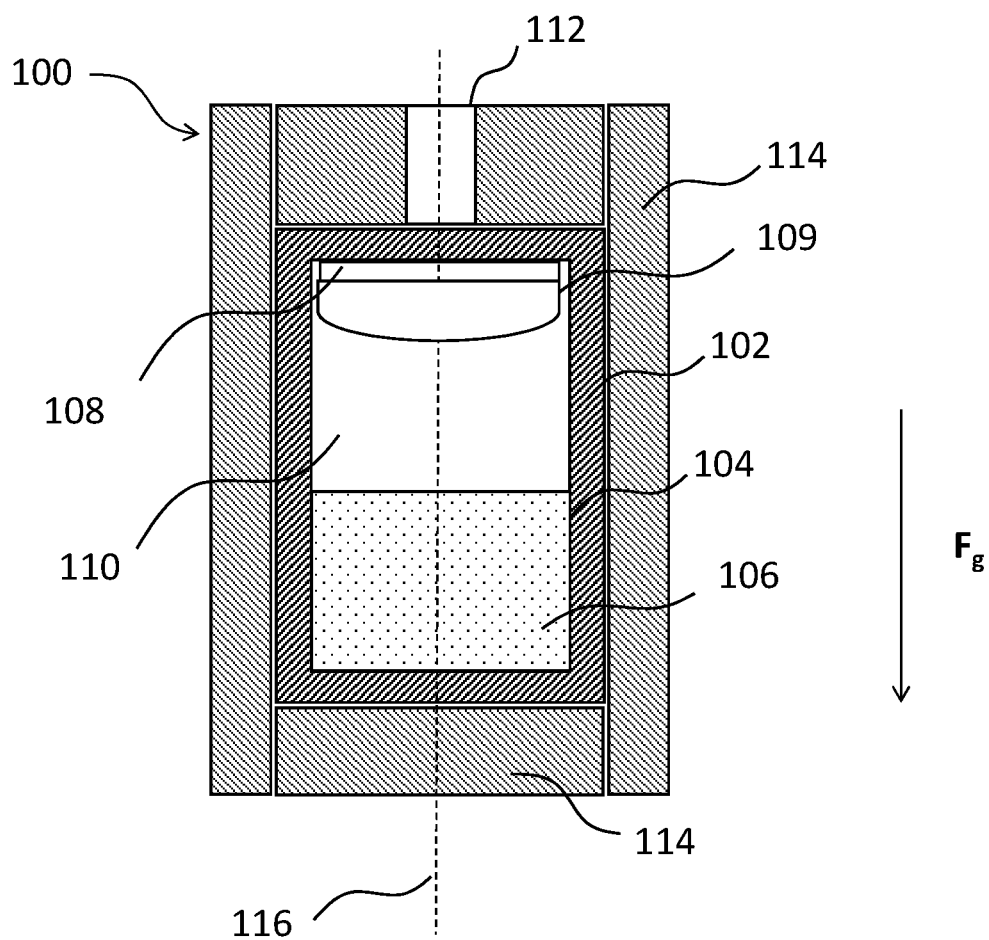
FIG. 1 is a sectional view of a vertically oriented PVT growth structure known in the art for growing a single crystal.

The present invention will now be more fully described hereinafter with reference to the accompanying drawings, in which exemplary embodiments of the invention are shown. The present invention may, however, be embodied in many different forms and should not be construed as limited to the embodiments set forth herein. Rather, these embodiments are provided so that the disclosure will convey the scope of the invention to those skilled in the art. Like numbers refer to like elements in the drawings throughout the specification.

The accompanying drawings are incorporated into and form a part of the present specification for the purpose of explaining the principles of the invention. The drawings are merely for the purpose of illustrating advantageous and alternative examples of how the invention can be made and used and are not to be construed as limiting the invention to only the illustrated and described embodiments.

The present invention will be described hereafter with reference to silicon carbide, however, it is envisaged to apply the principles of the present invention to the growth of single crystals, grown by physical vapor transport methods, using other semiconductor materials such as AlN. The concept of the present invention may be advantageously extended to all known PVT growth systems having a vertical reactor that receives vertical PVT growth structures known in the art.

Figure 2:
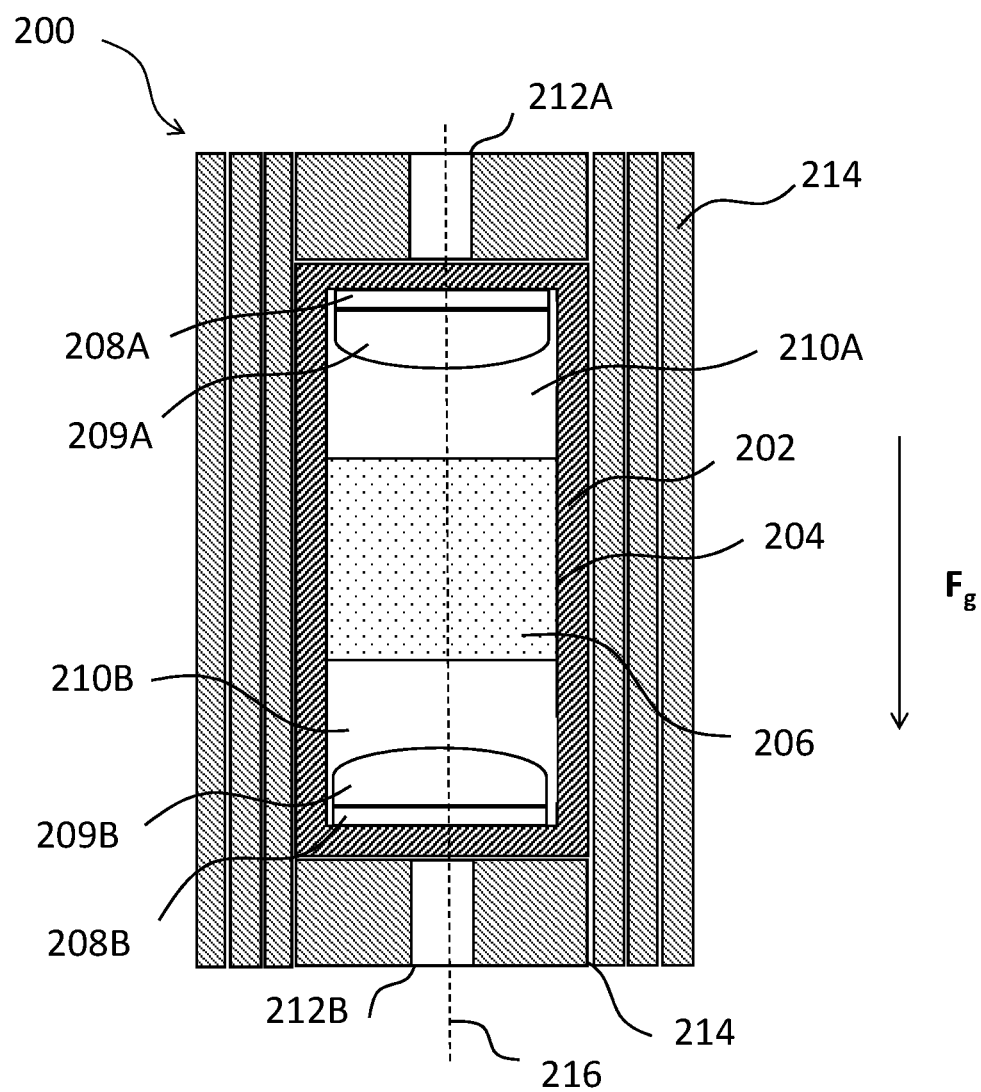
FIG. 2 is a sectional view of a PVT growth structure according to an embodiment for growing two single crystals are simultaneously on upper and lower sides of a PVT structure.

FIG. 2 shows a PVT growth structure 200 conventionally used in the vertical orientation for growing two single crystal boules 209A, 209B of a semiconductor material, such as SiC, simultaneously, and which can be advantageously employed by the present invention. The PVT growth structure 200 comprises a crucible 202 where a source material compartment 204 for the SiC source material 206 is provided in a central region that separates the crucible growth region in an upper and a lower growth compartment 210A and 210B. Seed crystals 208A and 208B are arranged in the separate growth compartments 210A and 210B, respectively, at a certain distance from the source material compartment 204 along a longitudinal axis 216. Each of the seed crystals 208A, 208B is cooled via a respective heat dissipation channel 212A, 212B to create a temperature gradient that transports the SiC vapor sublimed from the source material 206 towards the seeds 208A, 208B in the upper and lower growth compartments 210A and 210B. The source material 206, in an embodiment, is selected for growing single crystals of a semiconductor material from a group including at least silicon carbide, 4H-SiC, and a semiconductor containing group III-V elements.

Given the relative orientation of the seeds 208A, 208B with respect to the source material compartment 204 in FIG. 2, single crystal growth takes place in the direction of the longitudinal axis 216 of the crucible 202, from top to bottom in the upper growth compartment 210A and from bottom to top in the lower growth compartment 210B. Each of the upper and lower growth compartments 210A and 210B may be separated from the SiC source material 206 by a gas permeable porous barrier to ensure that only gaseous Si and C containing components enter the growth compartments 210A and 210B. The crucible 202, in an embodiment, is made from a porous material, such as graphite, through which the upper and lower growth compartments 210A, 210B receive a doping gas or an inert gas. The crucible 202 may be surrounded by a porous, insulating material 214.

Figure 3:
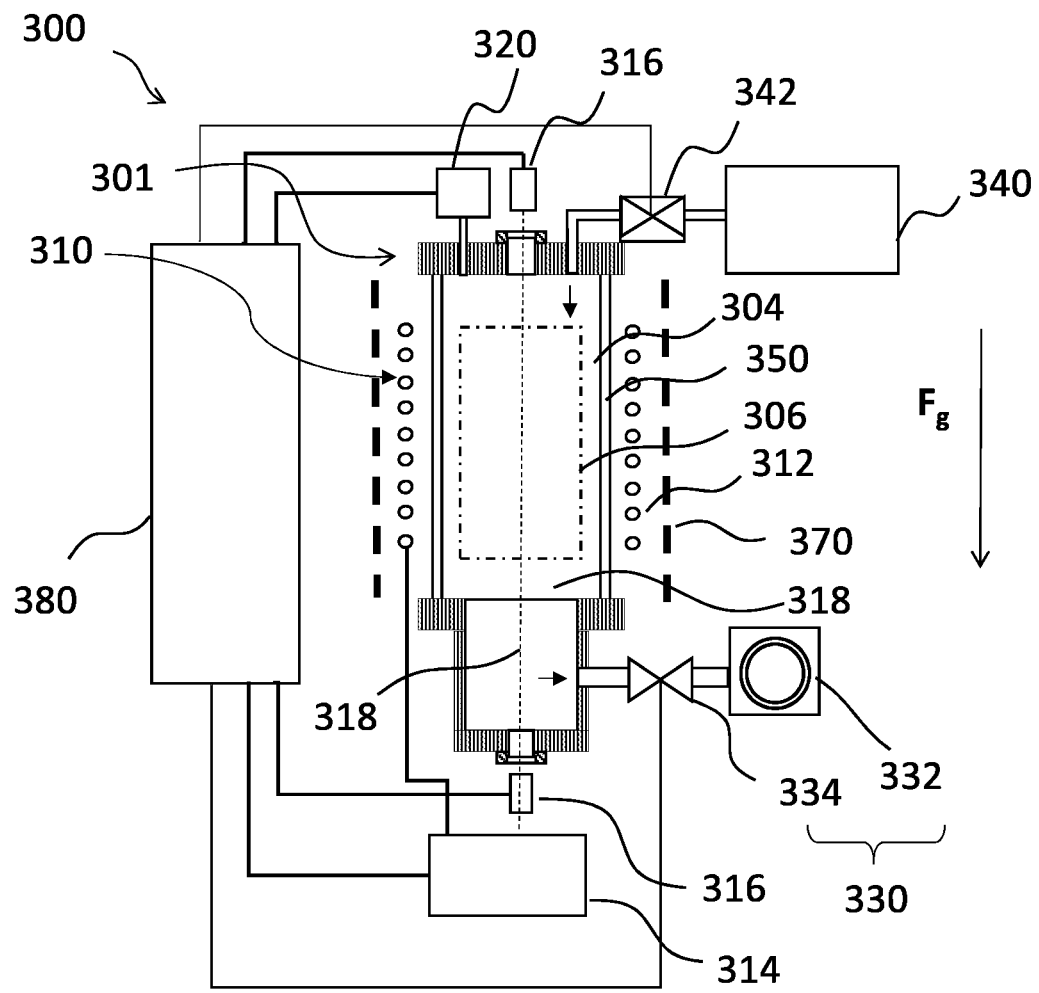
FIG. 3 is a schematic diagram of a PVT growth system having a vertical reactor for receiving a vertical PVT growth structure.

This type of vertical growth structure is conventionally used in vertical PVT growth systems, such as the example illustrated in FIG. 3. FIG. 3 shows conventional PVT growth system 300 having a vertical reactor 301 with an inner chamber 304, where a PVT growth structure 306 is vertically placed for growing the single crystal(s) under controlled temperature and vacuum conditions. In the shown embodiment, the PVT growth system 300 includes an inductive heating system 310 arranged around the reactor 301 to heat the source material inside the PVT growth structure 306 to a suitable growth temperature. The inductive heating system 310 is generally provided as an induction coil 312, placed on the outside of the reactor 301 along the reactor longitudinal axis 318 and connected to a MF generator/inverter 314 that supplies a controlled current to the induction coil 312. The induction coil 312 induces the flow of electric current in the electrically conductive wall of the PVT growth structure 306, which generates sufficient heat to sublime the source material. For instance, temperatures of more than 2000° C., and particularly, of about 2200° C., are generally used for PVT growth of SiC single crystals. The height of the induction coil 312 may be adjustable to allow fine-tune of the source material temperature and temperature gradients established inside the PVT growth structure 306. The temperature reached inside the PVT growth structure 306 may be measured using one or more temperature sensors 316, such as pyrometers or thermocouples, located close to the heating channels of the PVT growth structure 306.

The PVT growth system 300 also includes a pressure measuring system 320, possibly including a combination of pressure measuring devices, for measuring the pressure reached inside the reactor inner chamber 304. In order to create an appropriate atmosphere for the single crystal growth, the PVT growth system 300 includes a vacuum pump system 330 with one or more vacuum/extraction pumps 332 (for e.g. a vacuum pump and/or a high vacuum pump) and an adjustable control valve 334 for controlling the suction power of the vacuum pump 332. A gas supply 340 supplies one or more gaseous compounds (such as Ar and N containing components) to the reactor inner chamber 304 to create a suitable doping or inert atmosphere for single crystal growth. The gas supply 340 may be an interface to compressed gas cylinders provided on site or to a central gas supply. The supply of doping and inert gases to the reactor 301 is individually controlled by a mass flow controller (MFC) 342. A water cooling system 350 for dissipating the heat generated in the reactor 301 is provided, in general as two concentric and internally water-cooled glass tubes.

The reactor 301 and inductive heating system 310 are in general enclosed in a shield or Faraday cage 370 to reduce electromagnetic radiation. Further components of the PVT growth system 300 includes metal flanges for sealing the reactor 301, including glass inserts for measuring the temperature by pyrometers.

The above and other controllable process parameter systems of the PVT growth system 300 are controlled by a system controller 380, shown in FIG. 3, which adjusts the growth process parameters and records all data of the single crystal growth process, such as pressure, temperature, position of the induction coil, cooling water temperature, and the like. Exemplary operation of a PVT growth system of the type shown in FIG. 3 is fully described in U.S. Pat. No. 8,865,324 B2, and therefore, it will not be further detailed here.

Figure 4:
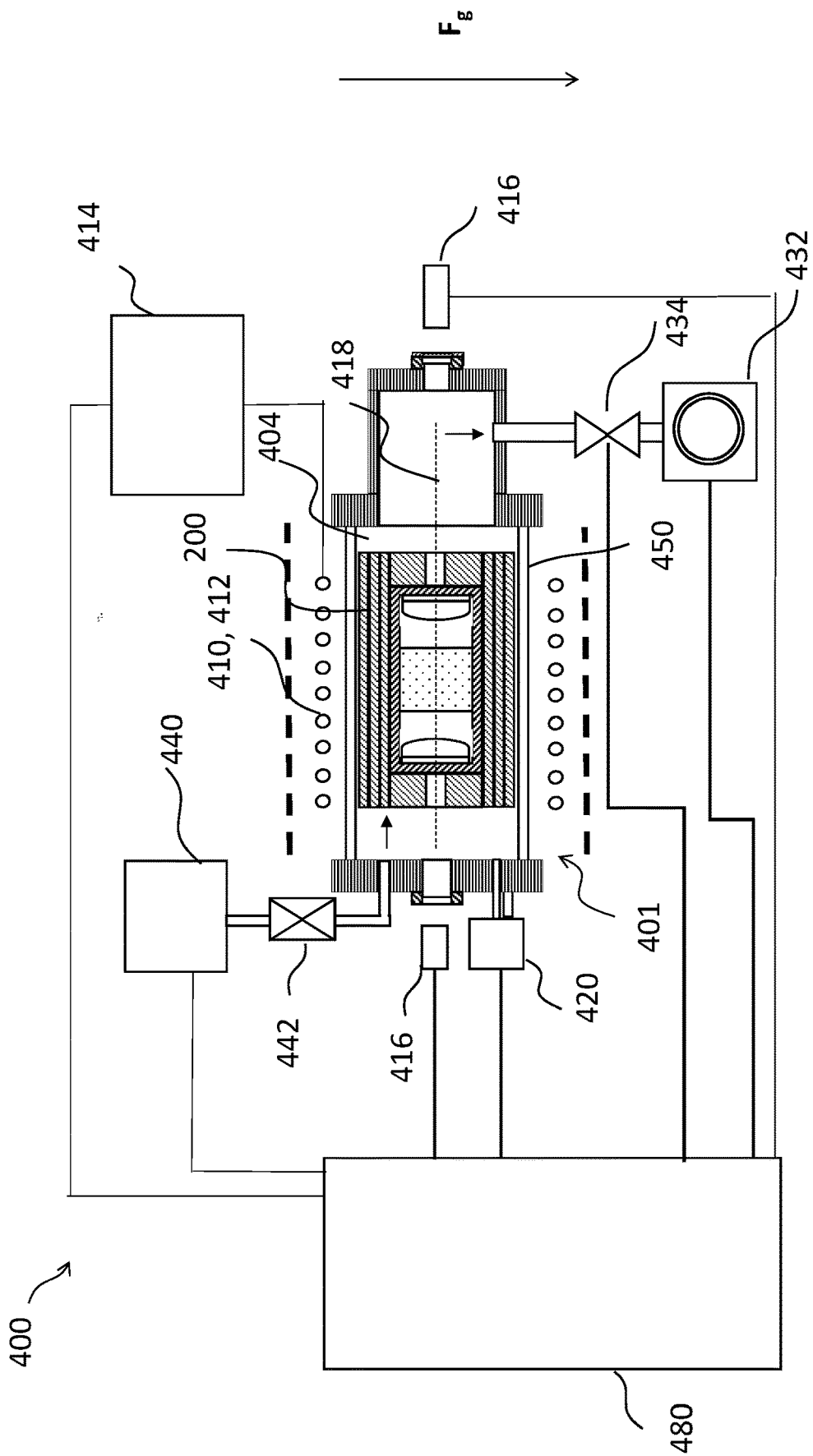
FIG. 4 is a schematic diagram of a PVT growth system having a horizontally oriented reactor according to an embodiment.

FIG. 4 shows an inductive-heated PVT growth system 400 having a horizontally oriented reactor 401 for horizontal growth of semiconductor crystal boule(s) according to an embodiment. The inductive-heated PVT growth system 400 has substantially the same characteristics of the inductive-heated PVT growth system 300 described above, with the difference that it comprises a reactor 401 that is oriented with its longitudinal axis 418 along a direction transverse to gravity. The horizontal orientation of the reactor 401 makes possible to accommodate inside a single PVT growth structure, such as the PVT structure 200 described above, in an horizontal orientation, i.e. with its longitudinal axis 216 aligned with the longitudinal axis 418 of the reactor 401, such that the single crystals boules 209A, 209B now located on a left and right side of the horizontally oriented PVT growth structure 200 grow in a direction that is substantially horizontal.

The growth direction and/or the longitudinal axis 216 of the PVT growth structure 200 do not have to necessarily make an horizontal angle of 0° (within a certain error margin) with the horizontal plane, i.e. the plane perpendicular to the direction of gravity Fg, as shown in FIG. 4. For instance, the reactor 401 and/or the PVT growth structure 200 inside the reactor 401 may be oriented such as to make a horizontal angle with the horizontal plane of less than a predetermined value, without departing from the principles of the present disclosure. In an embodiment, the value of the horizontal angle of the reactor 401 and/or the PVT growth structure 200 lies between −15° and +15°. In such an orientation of the PVT growth structure 200, the lateral inner walls of the PVT growth structure 200 that surround the semiconductor crystal boules 209A, 209B become essentially transverse to the gravity direction, and consequently, the graphite/carbon particles released therefrom, or at least most part, will fall by gravity on the lower inner wall of the PVT growth structure 200. As a result, it is possible to manufacture two single crystal boules 209A, 209B simultaneously and with high crystal quality. Similarly to the PVT growth system 300 described above, the PVT growth system 400 includes dedicated inductive heating system 410 with heating coils 412 that are supplied with a current from a MF generator 414 under the control of a system controller 480. The temperature reached in the reactor inner chamber may be measured and monitored using suitable temperature sensors 416, which are controlled by the system controller 480. In addition, the reactor 401 is also provided with cooling system 450, which is individually controlled and/or monitored by the system controller 480.

Figure 5:
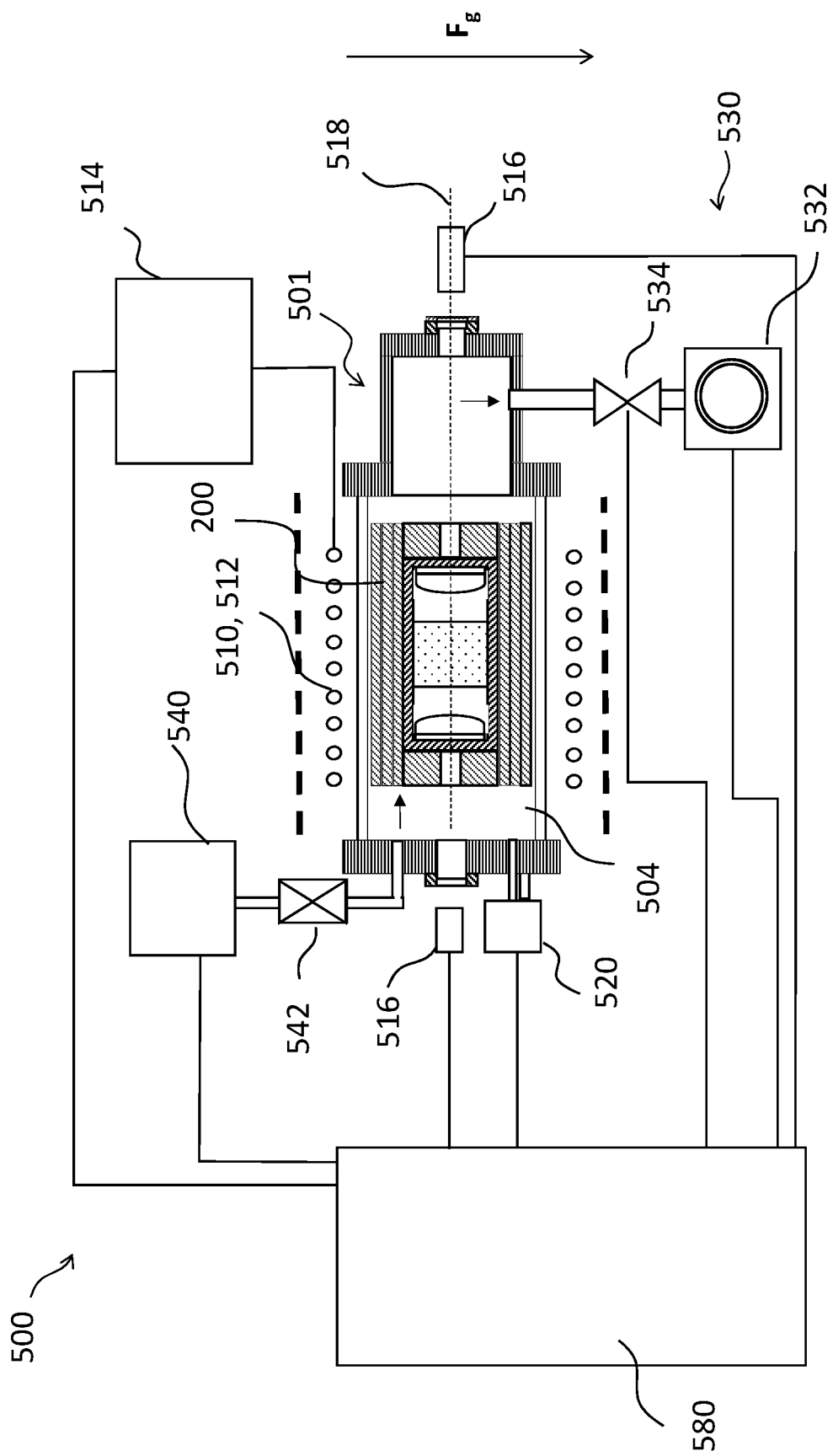
FIG. 5 is a schematic diagram of a PVT growth system having a horizontally oriented reactor according to another embodiment.

FIG. 5 shows an inductive-heated PVT growth system 500 having a horizontally oriented reactor 501 for horizontal growth of semiconductor crystal boule(s) according to a further embodiment, which essentially differs from the PVT system 400 shown in FIG. 4 in that it comprises a reactor 501 with a single glass tube. In this case, the dissipation of heat from the reactor 501 is not achieved by water cooling but rather by a flux of air, which is passed around the outer edge of the glass tube in a controlled manner. Similarly to the embodiment of FIG. 4, the reactor 501 is oriented horizontally such as to accommodate a PVT growth structure, such as the PVT growth structure 200 described above, in a substantial horizontal orientation, i.e. with its longitudinal axis 218 aligned with the reactor longitudinal axis 518. The PVT growth system 500 also comprises process control systems, including a inductive heating system 510, pressure measuring system 520, vacuum pump system 530, gas supply system 540, inductive heating and air cooling systems, which are similar to those described with reference to the PVT growth system 300 described above and controlled by a system controller 580 in a similar manner, and therefore, these will not be further detailed here.

Figure 6:
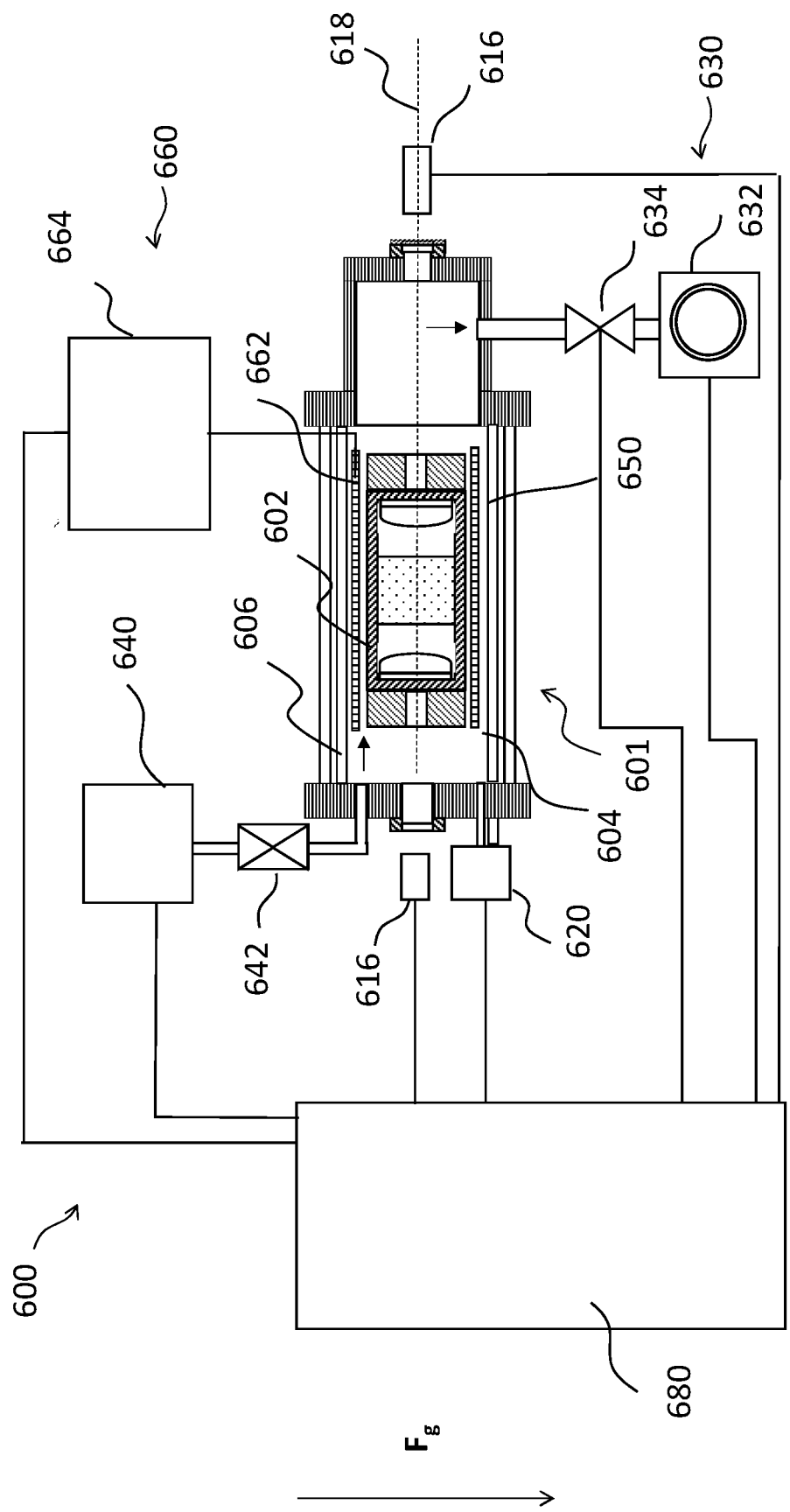
FIG. 6 is a schematic diagram of a PVT growth system having a horizontally oriented reactor according to another embodiment.

FIG. 6 shows an resistive-heated PVT growth system 600 having a horizontally oriented reactor 601 for horizontal growth of semiconductor crystal boule(s) according to a further embodiment, and which essentially differs from the PVT systems 400 and 500 described above in that it uses using a heating system 660 of a resistive type instead. The reactor 601 has an inner chamber 604 that accommodates an horizontally oriented PVT growth structure 602, similar to the PVT growth structure 200 described above but without insulating material covering the lateral walls due to the resistive heating. The resistive heating system 660 includes resistive heating elements 662 mounted inside the reactor 601. A heating current control unit 664 supplies current to the resistive heating elements 662 to heat the reactor inner chamber 604 in a controlled manner and achieve a suitable growth temperature. The reactor 601 may be made with walls of metal and provided with a respective water cooling system 650. Alternatively, an air cooling system, such as the one described above with reference to FIG. 5, may be used.

The PVT growth system 600 also comprises process control systems, such as a pressure measuring system 620, vacuum pump system 630, and gas supply system 640, which are similar to those described with reference to the PVT growth system 300 described above and controlled by a system controller 680 in a similar manner, and therefore, these will not be further detailed here.

In order to increase the production rate of single crystals, a PVT growth system may be provided having a plurality of horizontally oriented reactors, such as any of the reactors of the PVT growth systems 400, 500, 600, described above, and which are connected via a common channel vacuum to a common vacuum system.

FIG. 7 shows a PVT growth system 700 comprising N reactors 700A to 700N for growing more than one semiconductor single crystal simultaneously and which are connected to each other via a common vacuum channel 705. The reactors 700A to 700N are horizontally oriented, i.e. their longitudinal axis lie substantially on the horizontal plane transverse to the gravity direction, and are of a same type, such as to be operated at a same gas phase pressure conditions during the single crystals growth. The common vacuum channel 705 connects the N reactors 700A to 700N to a common vacuum pump system 730 in a serial manner so that one of the reactors is directly connected to the vacuum pump 732 whereas the other reactor(s) are evacuated via the common vacuum channel 705. This allows to create and control a gas phase composition (N and/or Ar) in the inner chambers 704 with a same pump system 730 while ensuring that the substantially same gas phase composition (N and/or Ar) can be achieved and maintained in all reactors 700A to 700N during the growth process. The vacuum conditions and/or pressure in the reactors inner chambers are centrally controlled by the system controller 780 via an adjustable control valve 734 provided between the vacuum pump 732 and the reactor 700N at the end of the vacuum channel 605 that is closer to the vacuum pump 732. Thus, the pressure inside the inner chambers of reactors 700A to 700N can be controlled simultaneously in a centralized manner and without the need of separate vacuum systems and controllers for each reactor.

The PVT growth system 700 shown in FIG. 7 also includes a pressure measurement system 720 having one or more pressure sensors that may be arranged in at least one of the reactors 700A to 700N to perform measurements indicative of a pressure reached in the respective reactor inner chambers. A suitable doping and/or inert gaseous atmosphere for the single crystals growth is achieved in the inner chambers of each reactor 700A to 700N by supplying the gaseous components that form the doping/inert gaseous atmosphere via individual gas feeds from a gas supply, and which are individually controlled by the system controller 780 via dedicated mass flux controllers. The pressure measurement system 720 monitors the pressure measured by the pressure sensor(s), and outputs vacuum control parameters for controlling the adjustable control valve 734 to regulate the pressure inside the reactors inner chambers to a predetermined pressure. The pressure measurement system 720 outputs also gas phase control parameters, based on the monitored pressure, for the MFCs controlling the supply of the gaseous components into the reactors inner chambers, such as to achieve and maintain substantially the same predetermined gas phase conditions (i.e. pressure an composition of the doping/inert gas atmosphere) over all the reactors connected via the common vacuum channel 705.

In the embodiment shown in FIG. 7, each reactor 700A to 700N may be of any type, such as the reactors 401, 501, 601 of the PVT growth systems 400, 500 and 600 described above, for which respective heating systems are provided and controlled via respective MF generators to reach the required temperature conditions in each reactors 700A to 700N individually and using individual growth process parameters for each reactor 700A to 700N. The temperature reached in the reactors inner chambers may be measured and monitored using suitable temperature sensors under control of the system controller 780. In addition, the reactors 700A to 700N are provided with respective cooling systems, which are individually controlled and/or monitored by the system controller 780, for dissipating heat from the respective reactors 700A to 700N. The cooling systems may be based on water cooling or air cooling system, depending on the type of reactor such as described above.

The operation of the inductive heating system, cooling system, and temperature control is essentially the same as in the conventional PVT growth system 300 described above with reference to FIG. 3, and may be controlled individually or using a common controller or PC, in order to save space and equipment costs. However, the growth process parameters that play a major critical role in the final properties of the grown single crystal(s), i.e. pressure and composition of the doping/inert gas phase, are controlled in a central manner by the same system controller 780 which, under monitorization by the pressure measurement system 720, adaptively adjusts the pressure inside the reactors inner chambers via control of the single adjustable control valve 734 connected to the common vacuum channel 705 and the amount of the gaseous components fed into the inner chambers from the gas supply via control of the individual MFCs. This allows to achieve a better control and reproducibility of the critical growth process parameters in comparison with PVT growth systems based on the conventional "isolated" reactor concept.

In an embodiment, the pressure sensor(s) measure the pressure at the reactor 700A that is more distant from the reactor 700N directly connected to the vacuum pump system 730 along the common vacuum path 705. The pressure sensor(s) may be located to measure pressure on the top side of the reactor 700A. In an alternative configuration, the pressure sensor(s) may also be provided in a bottom side of the reactor 700A. The amount of doping or inert gases can be supplied to all reactors simultaneously by a common gas duct under control of a common MFC, thereby, eliminating supply differences due to slight differences in response from individual MFCs and facilitating the growth process control. Furthermore, measurement and monitoring of pressure inside the reactors inner chambers may be performed by pressure sensors located on only one of the reactors without significant loss of accuracy, with additional savings on space and equipment costs.

The number N of reactors connected by a common vacuum channel 705 in the PVT growth system 700 shown in FIG. 7 can be selected as any integer between 2 and 20, and in an embodiment, between 6 and 10. Such a limitation on the number of connected reactors may be desirable to avoid imposing high demands on the exhaustion capabilities of the vacuum pump system 730 while allowing to reach a suitable vacuum condition for the growth process within an acceptable time for most applications. Thus, any of the vacuum pump systems used in conventional PVT growth systems using a single reactor may be advantageously employed as the vacuum pump system 730 in the PVT growth system 700.

On the other hand, the number N of reactors connected to the common vacuum channel 705 does not need to be fixed and may easily be increased or decreased according to need by simply adding or removing the vacuum connections of the additional or unnecessary reactors to the common vacuum channel.

Consequently, the present invention makes possible to manufacture one or a plurality of single crystal simultaneously while reducing or even eliminating contamination effects due to graphite/carbon particles by using horizontally oriented PVT growth systems and/or horizontally oriented PVT growth reactors. The horizontal orientation also makes possible to, for instance, make use of PVT growth structures designed to allow simultaneous growth of two crystals, such as described above with reference to FIG. 2, without the disadvantage of the lower crystal being contaminated by graphite/carbon particles.

Figure 8B:
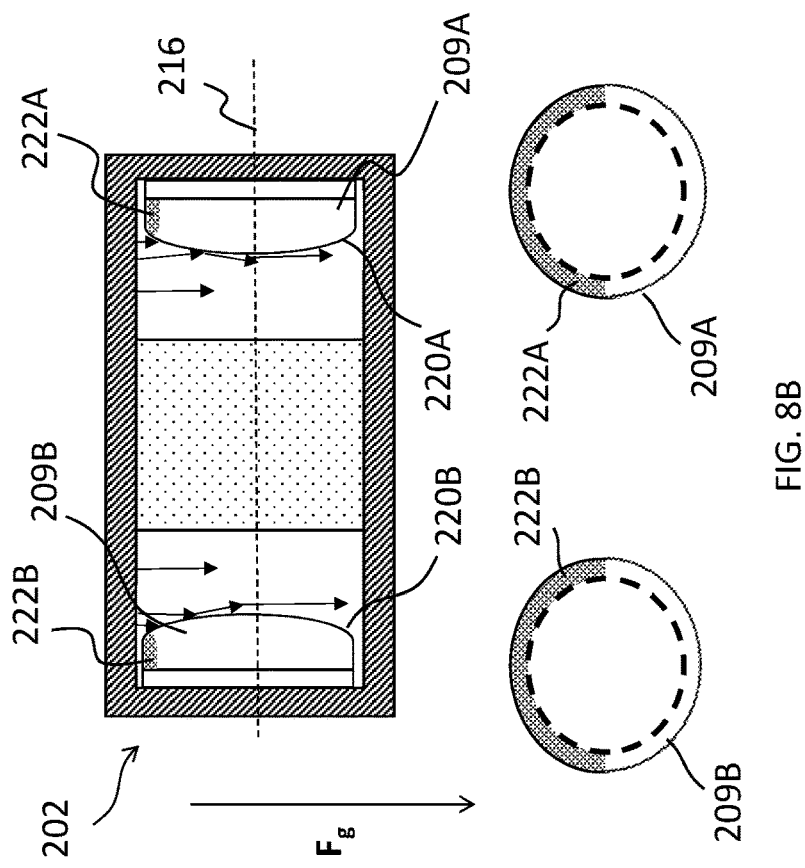
FIG. 8B is a sectional view of a crucible of the PVT growth structure illustrating the effect of carbon contamination in the upper and lower semiconductor boules when the PVT growth structure is oriented in a horizontal direction with respect to a gravity direction.
Figure 8A:
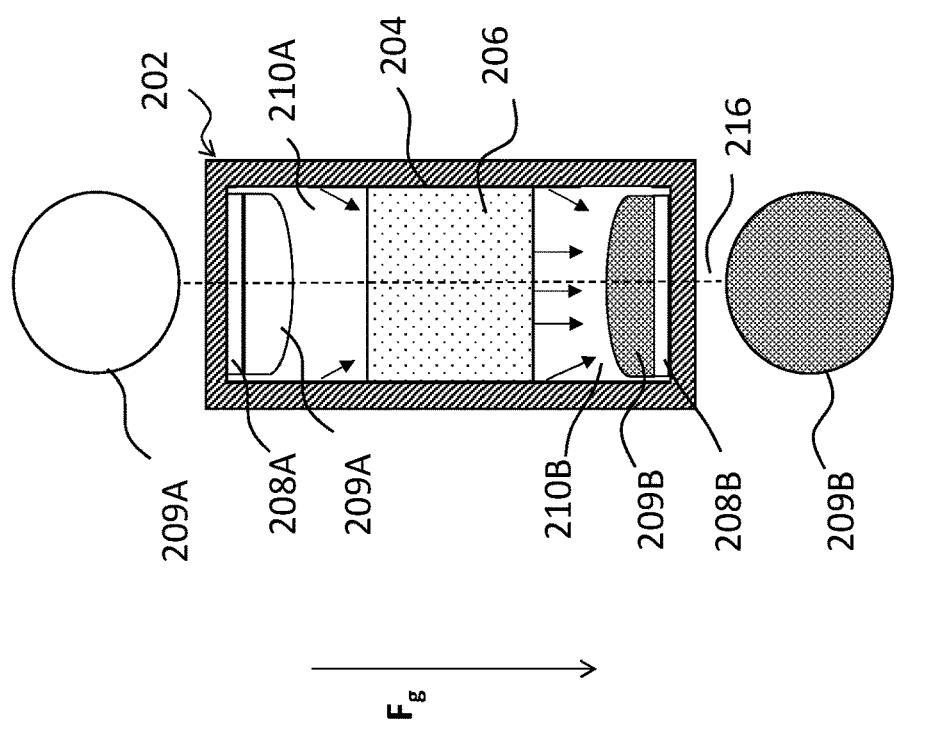
FIG. 8A is a sectional view of a crucible of the PVT growth structure illustrating the effect of carbon contamination in the upper and lower semiconductor boules when the PVT growth structure is oriented in a vertical direction with respect to a gravity direction.

FIGS. 8A and 8B illustrate the effects of graphite/carbon contamination with reference to the crucible 202 of the PVT growth structure 200 during simultaneous growth of two semiconductor crystal boules 209A, 209B on the upper and lower growth compartments 210A, 210B when the PVT growth structure is oriented in: a vertical orientation in FIG. 8A, and a horizontal orientation with respect to the gravity direction (Fg) in FIG. 8B.

As shown in FIG. 8A, the semiconductor boule 209B growing in the lower growth compartment 210B is strongly contaminated with released graphite/carbon particles falling in the direction of the lower crystal seed 208B by the effect of gravity, in comparison with the semiconductor boule 209B growing in the upper compartment 210A, which remains essentially unaffected by graphite/carbon contamination during the whole growth process. The contaminating graphite/carbon particles come from, for example the cylindrical wall of the lower compartment 210B that is concentrically arranged around the crystal 209B and along the crucible longitudinal axis 216, from the material of a membrane that separates the source material from the lower growth compartment 210B, and/or other parts of the PVT growth structure that surround the crystal or which are used closed thereto.

In the horizontally oriented crucible 202 shown in FIG. 8B, contamination graphite/carbon particles no longer fall onto the whole growth surface 220B of the semiconductor boule 209B during crystal growth. However, depending on the curvature of the growth surfaces 220A, 220B of the semiconductor crystal boules 209A, 209B, a portion of carbon/graphite particles released from the lateral walls of the crucible 202 and/or other component parts may still hit at least a portion of the growth surfaces 220A, 220B and penetrate by into the crystal boules 209A, 209B. This might lead to carbon/graphite inclusions being incorporated in lateral upper layers 222A, 222B of a given thickness on both semiconductor crystal boules 209A, 209B and over the whole length of the semiconductor crystal boules 209A, 209B along the longitudinal direction 216, as illustrated in FIG. 8B, thereby disrupting crystal quality at the upper outer edge of the semiconductor boules 209A, 209B.

Thus, in order to reduce to a minimum the thickness of such carbon/graphite inclusion layers 222A, 222B, the growth process may follow one or both of the process conditions described below.

A first process condition is that a cross-sectional area of the crystal boule 209A, 209B of diameter s, shown in FIGS. 9A-9C, should be free of inclusions within a diameter that substantially corresponds to the diameter desired for the substrate that will be later produced from the single crystal boules 209A, 209B and during the entire growth time (where growth time=total process time—on-seed growing time, the on-seed growing time corresponding to the time necessary to reach the desired crystal longitudinal length, which is generally greater than 5 mm). This first process condition may be achieved by controlling the growth process parameters such that the curvature of the growth surfaces 220A, 220B has a maximum height h, with respect to the circle segment corresponding to the cross-section with diameter "s", that lies within a suitable height range for which the negative effects mentioned above do not take place or are at least minimized, a suitable height range being between a minimum value hMIN=2 and a maximum value hMAX=8 mm (and in an embodiment, between hMIN=4 mm and hMAX=6 mm), independently of the desired diameter of the final substrate and independently of the diameter of the crystal seeds 208A, 208B, which substantially corresponds to the diameter of the crystal boules 209A, 209B. Thus, in case the height h falls below hMIN (e.g. h<2 mm), undesired modifications and consequent degradation of the crystal quality may occur.

In case the height h exceeds the maximum hMAX (e.g. h>8 mm), the graphite/carbon particles falling from the crucible inner walls and/or the membrane may hit onto the growing crystal 209B (or 209A) and form inclusions, which would lead to a considerable "upper half" 222B of the horizontally growing crystal being interspersed with graphite/carbon particles, as shown in FIG. 9C.

FIGS. 9A and 9B illustrate the case where a curvature height h corresponding to hMIN=2 mm and hMAX=8 mm is used, and consequently, undesired modifications, which could occur due to a too large or too small curvature of the crystal surface 220B, may be avoided. In this case, the graphite/carbon particles may still touch the growth surface 220B of the crystal boule 209B but fall due to the gravitational force on the lower, inner side wall of the growth crucible 202 without being incorporated in the crystal 209A itself. At most, only a thin upper layer 222B on the semiconductor boule 209B might be affected.

In order to ensure that the heights h of the growth surfaces 220A, 220B are maintained within the predetermined range [hMIN; hMAX] mentioned above, suitable growth process parameters for achieving a corresponding curvature of the growth surfaces 220A, 220B, such as the temperature gradient inside the crucible 202, may be determined based on characteristics of the reactor and respective crucible, the required diameter and length for the semiconductor boules 209A, 209B, the substrate diameter s, and the required temperatures for the PVT growth process, for instance based on simulation analysis.

A second process condition is that the base of the crystal seed 208A used for the monocrystal growth has a diameter of at least 10% larger than the diameter of the inclusion-free cross-section s. This second condition addresses the shortcoming that the requirement of the first condition described above for the curvature of the growth surface 220A cannot be met in the edge region of the crystal boule 209A. The local curvature of the growth surface 220A in the edge region is, in an embodiment, significantly larger to avoid that the crystal boule 209A grows together with the inner wall of the crucible 202. Graphite/carbon particles will then always build-up in the edge region of the single crystal boule, which may be later removed by subsequent processing of the crystal boule to the final substrate diameter (for e.g., by cylindrical grinding). Thus, it is necessary to use a seed with a diameter that is substantially equal to an outer diameter of the single crystal to be grown therein and at least 10% larger than a predetermined diameter for a substrate to be made from the single crystal, and in an embodiment, a seed crystal diameter that is 10% to 35% larger than the predetermined substrate diameter.

Thus, the present invention provides a novel concept of PVT growth systems for manufacturing one semiconductor single crystal boule or more than one semiconductor single crystal boules simultaneously in a horizontal growth direction, which allows to increase the rate of production of semiconductor single crystals while ensuring homogeneous high quality crystals, and thereby reduces losses due to rejection, in comparison with semiconductor single crystals manufactured in PVT growth systems based on the vertically oriented reactor and/or vertical crucible concept.

A further advantage of the PVT growth systems according to the present invention can be seen in the fact that it may be advantageously implemented using any type of vertical growth reactor. Further, by connecting several horizontal reactors via a common vacuum channel to a common vacuum pump system, it is possible to simultaneously manufacture more than one semiconductor single crystal boules by making use of conventional crucibles in horizontally orientation, i.e. without the need of changing the crucible dimensions and/or the amount of source materials, which results in cost savings in comparison with PVT growth systems that use crucibles with an enlarged diameter for enclosing several crystal seeds and an enlarged material source.

Finally, although the description of the embodiments illustrated in FIGS. 3-7 was made by reference to the PVT growth structure 200, which allows to grow two semiconductor single crystals simultaneously, the principles of the present invention may also be advantageously applied to other types of PVT growth structures than those illustrated, and with configurations that allow to grow one or more than two single crystals at a time.

TABLE 1

| | Reference Signs |
|---|---|
| 100, 200, 306, 602 | PVT growth structure |
| 102, 202 | Crucible |
| 104, 204 | Source material compartment |
| 106, 206 | Source material |
| 108, 208A, 208B | Seed crystal(s) |
| 109, 209A, 209B | Single crystal boule(s) |
| 110, 210A, 210B | Growth compartment(s) |
| 112, 212A, 212B | Heat dissipation channel(s) |
| 114, 214 | Thermal insulationlayer(s) |
| 116, 216 | Longitudinal axis of PVT growth structure |
| 220A, 220B | Growth surface of single crystal boules |
| 222A, 222B | Inclusion layer |
| 318, 418, 518, 618 | Longitudinal axis of reactor |
| 300, 400, 500, 600, 700 | PVT growth system |
| 301, 401, 501, 601 | Reactor |
| 304, 404, 504, 604 | Inner chamber |
| 606 | Reactor metal walls |
| 310, 410, 610, 710 | Inductive heating system |

TABLE 1-continued

| Reference Signs | |
|---|---|
| 312, 412, 512 | Induction coil |
| 314, 414, 514 | MF generator/inverter |
| 316, 416, 516, 616 | Temperature sensors |
| 320, 420, 520, 620, 720 | Pressure measuring system |
| 622 | Pressure sensor(s) |
| 330, 430, 530, 630, 730 | Vacuum pump system |
| 332, 432, 532, 632, 732 | Vacuum pump |
| 334, 434, 534, 634, 734 | Adjustable control valve |
| 340, 440, 540, 640, 742 | Gas supply |
| 342, 442, 542, 642 | MFC (mass flux controller) |
| 350, 450, 650 | Water cooling system |
| 660 | Resistive heating system |
| 662 | Resistive heating elements |
| 664 | Heating current control unit |
| 370 | Shield |
| 380, 480, 580, 680, 780 | System controller |
| 700A to 700N | Reactors |
| 705 | Common vacuum channel |

What is claimed is:

1. A system for manufacturing one or more single crystals of a semiconductor material by physical vapor transport (PVT), the system comprising:
a PVT growth structure including a crucible having a source material compartment containing a source material and a pair of growth compartments each on a side of the source material compartment, a crystal seed is disposed in each growth compartment and is at a certain distance along a longitudinal axis of the PVT growth structure from the source material for growing respective single crystals from the source material;
a reactor having an inner chamber adapted to accommodate the PVT growth structure for growing the one or more single crystals inside, the reactor accommodates the PVT growth structure in an orientation with a growth direction of the one or more single crystals inside the PVT growth structure substantially horizontal with respect to a direction of gravity or within an angle from horizontal of less than a predetermined value, the angle from horizontal is between −15° and +15° with respect to a horizontal plane perpendicular to the direction of gravity;
a heating system adapted to heat the PVT growth structure inside the inner chamber of the reactor; and
a system controller controlling a plurality of parameters of a PVT growth process in the reactor, the parameters include at least one of a pressure inside the inner chamber of the reactor, a growth temperature, and a gas supply of doping and/or inert gases to the inner chamber, the system controller monitors the growth temperature and controls the PVT growth process with a plurality of PVT growth process parameters to ensure that a growth surface of each of the one or more single crystals achieves a curvature with a maximum height in the growth direction that is maintained within a height range from 2 mm to 8 mm during the PVT growth process, the PVT growth process parameters are determined for the reactor based on characteristics of the reactor and the crucible, a predetermined diameter and length of the one or more single crystals to be grown inside the PVT growth structure, a predetermined diameter of an inclusion-free cross-section to be formed on the one or more single crystals, and temperatures for the PVT growth process using simulation analysis, the crystal seed in each growth compartment has a diameter of at least 10% larger than the predetermined diameter of the inclusion-free cross-section of the single crystal grown therein.

2. The system of claim 1, wherein the height range is from 4 mm to 6 mm and/or the reactor is horizontally oriented with respect to the gravity direction to accommodate the PVT growth structure.

3. The system of claim 1, wherein the source material is selected for growing single crystals of a semiconductor material from a group including at least silicon carbide, 4H-SiC, and a semiconductor containing group III-V elements.

4. The system of claim 1, further comprising a plurality of reactors each having an inner chamber adapted to accommodate a respective PVT growth structure for growth of one or more semiconductor single crystal, each reactor and respective PVT growth structure are horizontally oriented with respect to the direction of gravity such that the growth direction of the one or more single crystals in the PVT growth structure is horizontal or within the angle from horizontal.

5. The system of claim 4, wherein a pair of the plurality of reactors are connected by a common vacuum channel, the common vacuum is connectable to a vacuum pump system for creating and/or controlling a common gas phase condition in the inner chambers of the pair of reactors.

6. The system of claim 5, further comprising a pressure measurement system having a pressure sensor arranged in at least one of the pair of reactors connected via the common vacuum channel, the pressure sensor measuring a pressure of the gas phase condition reached in the inner chambers.

7. The system of claim 6, wherein the pressure measurement system monitors the pressure and outputs a plurality of vacuum control parameters for controlling the vacuum pump system and a plurality of gas phase control parameters for controlling a gas supply system to feed gaseous components that form the gas phase condition in the inner chambers such as to reach and maintain a same, predetermined gas phase condition in all connected inner chambers, the gas phase condition includes a pressure and/or a composition of the gas phase.

8. The system of claim 6, wherein
the pressure sensor measures the pressure at a reactor of the pair of reactors that is more distant from a connection to the vacuum pump system along the common vacuum channel; and/or
the pressure sensor measures the pressure on the common vacuum channel on a lower region of the pair of reactors.

9. The system of claim 1, further comprising:
a cooling system adapted to dissipate heat from the reactor, the cooling system is one of or a combination of a water-cooling system and an air-cooling system, the heating system is one of an inductive-heating system and a resistive-heating system.

* * * * *